(12) United States Patent
Yang et al.

(10) Patent No.: US 8,975,153 B2
(45) Date of Patent: Mar. 10, 2015

(54) SUPER JUNCTION TRENCH METAL OXIDE SEMICONDUCTOR DEVICE AND METHOD OF MAKING THE SAME

(71) Applicant: Taiwan Semiconductor Manufacturing Co., Ltd., Hsin-Chu (TW)

(72) Inventors: Tai-I Yang, Hsinchu (TW); Hong-Seng Shue, Zhubei (TW); Kun-Ming Huang, Taipei (TW); Tzu-Cheng Chen, Taipei (TW); Ming-Che Yang, Hsinchu (TW); Po-Tao Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/866,102

(22) Filed: Apr. 19, 2013

(65) Prior Publication Data

US 2014/0264559 A1 Sep. 18, 2014

Related U.S. Application Data

(60) Provisional application No. 61/781,540, filed on Mar. 14, 2013.

(51) Int. Cl.

| H01L 21/02 | (2006.01) |
| H01L 29/78 | (2006.01) |
| H01L 21/8238 | (2006.01) |
| H01L 27/092 | (2006.01) |
| H01L 29/66 | (2006.01) |

(52) U.S. Cl.
CPC ........ *H01L 29/7802* (2013.01); *H01L 21/8238* (2013.01); *H01L 27/092* (2013.01); *H01L 29/66712* (2013.01)
USPC .................. 438/430; 257/E21.597; 438/479; 438/637

(58) Field of Classification Search
CPC .............. H01L 21/84; H01L 21/31144; H01L 27/1087
USPC ........... 438/430, 479, 637, 639; 257/E21.597
See application file for complete search history.

(56) References Cited

U.S. PATENT DOCUMENTS

| 6,555,891 | B1 * | 4/2003 | Furukawa et al. ............. 257/505 |
| 7,037,789 | B2 | 5/2006 | Yamauchi et al. |
| 7,811,907 | B2 | 10/2010 | Shibata et al. |
| 8,188,543 | B2 * | 5/2012 | Roggenbauer et al. ....... 257/354 |
| 8,273,664 | B2 | 9/2012 | Cheng et al. |
| 2005/0106847 | A1 * | 5/2005 | Hiruta et al. .................. 438/585 |

* cited by examiner

*Primary Examiner* — John C Ingham
(74) *Attorney, Agent, or Firm* — Duane Morris LLP

(57) ABSTRACT

A method for forming a semiconductor device includes forming a hard mask layer over a substrate comprising a semiconductor material of a first conductivity type, and forming a plurality of trenches in the hard mask layer and extending into the substrate. Each trench has at least one side wall and a bottom wall. The method further includes forming at least one barrier insulator layer along the at least one side wall and over the bottom wall of each trench, removing the at least one barrier insulator layer over the bottom wall of each trench, and filling the plurality of trenches with a semiconductor material of a second conductivity type.

19 Claims, 9 Drawing Sheets

FIG. 11A

SUPER JUNCTION TRENCH METAL OXIDE SEMICONDUCTOR DEVICE AND METHOD OF MAKING THE SAME

This application claims the benefit of U.S. Provisional Application No. 61/781,540, filed Mar. 14, 2013, which application is expressly incorporated by reference herein in its entirety.

FIELD

The disclosed method and device relate to semiconductors. More particularly, the disclosed subject matter relates to a method for making a super junction trench metal oxide semiconductor (MOS) device, and the resulting super junction trench MOS device.

BACKGROUND

Complementary metal oxide semiconductor (CMOS) technology is a building block for integrated circuits, and CMOS devices are scaled to smaller sizes for advanced performance targets. CMOS technology includes N-type metal oxide semiconductors (NMOS) and P-type metal oxide semiconductors (PMOS). For example, a metal-oxide-semiconductor field-effect transistor (MOSFET) is a transistor used for amplifying or switching electronic signals.

A CMOS transistor generally comprises a semiconductor substrate, a channel layer above the semiconductor substrate, a gate oxide layer and a gate electrode above the channel layer, and a source region and a drain region above semiconductor substrate. Contacts, such as metal plugs, are made to the gate electrode and to both the source and drain regions of the transistor.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

Figure 1:
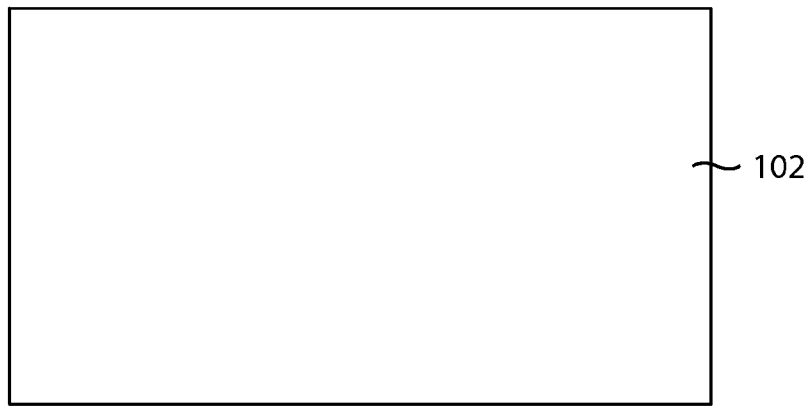
FIGS. 1-10 illustrate an exemplary process of making a semiconductor device such as a MOS transistor device having a super junction structure in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A MOS transistor device having a super junction structure are built on alternating regions of p-type doped and n-type doped semiconductor materials. In some embodiments, a method for making such a device comprises forming trenches in a semiconductor substrate comprising the first semiconductor material, and then filling the trenches with a second semiconductor material. In some embodiments, the second semiconductor material is formed through epitaxial growth although the second semiconductor material can be formed through different processing techniques. The first and the second semiconductor materials are of different conductivity types. Because of the high aspect ratio of the trenches, some defects such as seams and voids may exist in the trenches after filling with the second semiconductor material.

The present disclosure provides a method for forming a semiconductor device, and resulting semiconductor device. In some embodiments, the semiconductor device is a MOS transistor device having a super junction structure. Such a device can be also called a super junction trench MOS device. The semiconductor device has reduced defects and improved device performance including, but not limited to, low turn-on transistor resistance, low power loss and high break-down voltage. The semiconductor device has good energy efficiency.

In the present disclosure, a semiconductor device includes, but is not limited to, a MOS transistor device having a super junction structure. In FIGS. 1-11, like items are indicated by like reference numerals, and for brevity, descriptions of the structure, provided above with reference to the previous drawings, are not repeated.

Figure 10:
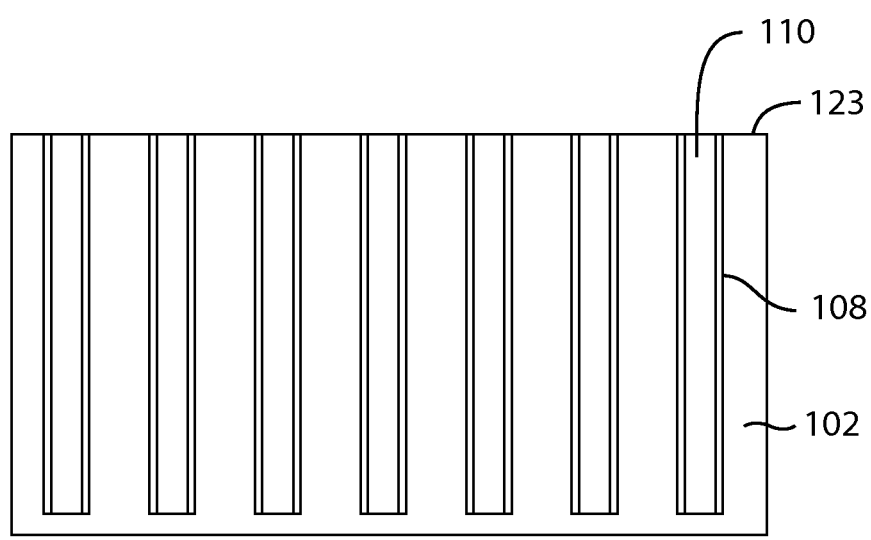
Figure 11:
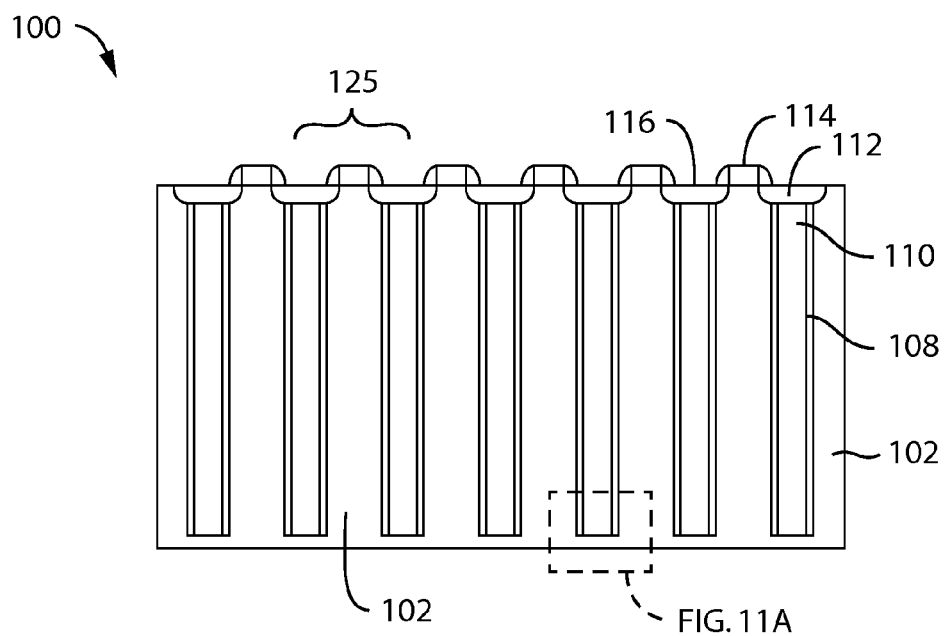
FIG. 11 illustrates an exemplary semiconductor device such as a MOS transistor device having a super junction structure in accordance with some embodiments.
Figure 12:
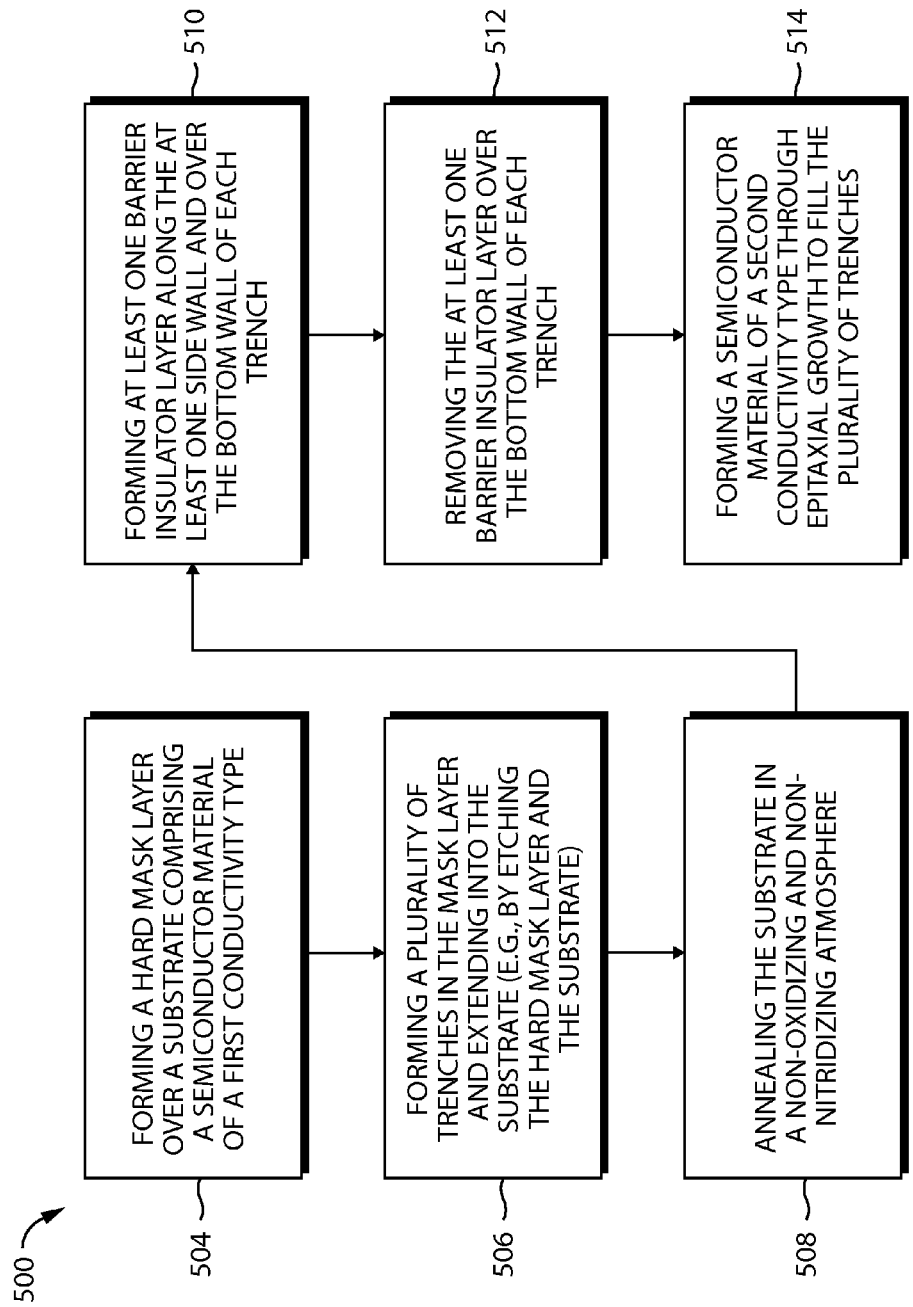
FIGS. 12 and 13 are flow charts illustrating an exemplary process of making a semiconductor device in accordance with some embodiments.
Figure 13:
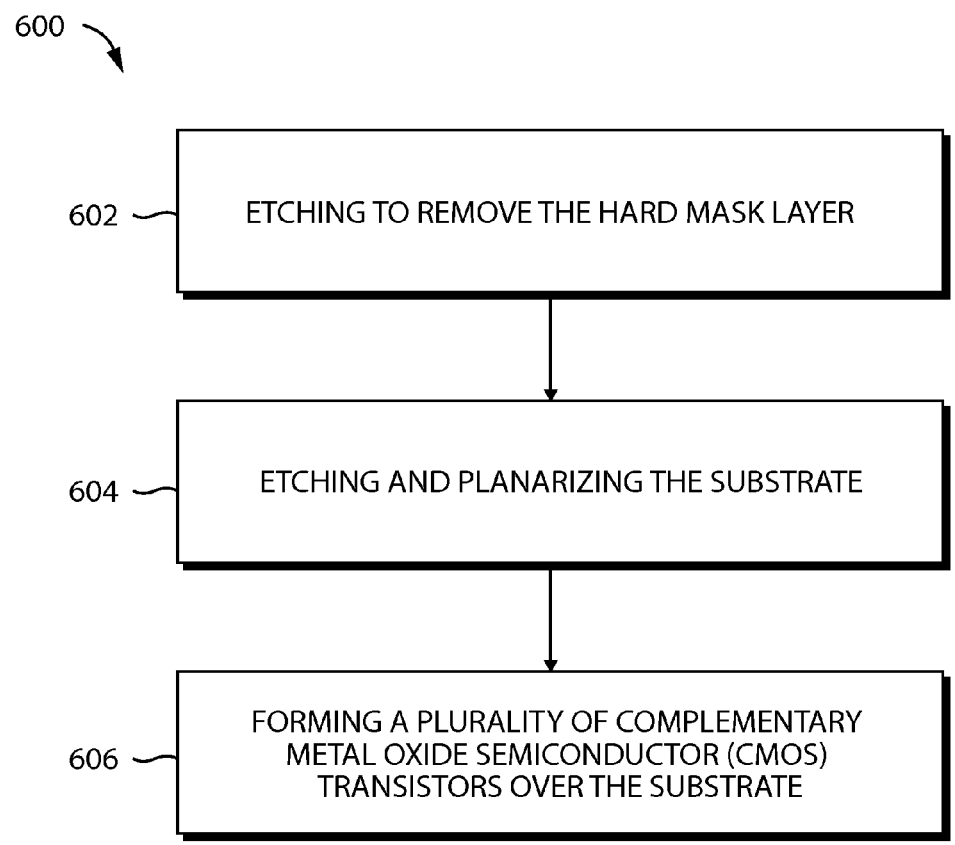

The methods described in FIGS. 12 and 13 are described with reference to the exemplary structure described in FIGS. 1-11. FIGS. 12 and 13 are flow charts illustrating an exemplary method (500 and 600) of making a semiconductor device such as a MOS transistor device having a super junction structure in accordance with some embodiments.

Referring to FIG. 12 and FIG. 1, before step 504, a substrate 102 is provided. Substrate 102 can be a wafer comprising a semiconductor material. Examples of suitable materials for substrate 102 include, but are not limited to, silicon, germanium, a compound semiconductor, and a semiconductor-on-insulator (SOI) substrate. A compound semiconductor can be a III-V semiconductor compound such as gallium arsenide (GaAs). An SOI substrate can comprise a semiconductor material on an insulator such as glass. In some embodiments, substrate 102 comprises a semiconductor material of a first conductivity type, for example, an n-type semiconductor. Substrate 102 can be n-type doped silicon in some embodiments. N-type semiconductor is a silicon material doped with B, $BF_2$, or any other suitable n-type dopants in some embodiments. Substrate 102 is of a p-type semiconductor such as p-type silicon in some other embodiments. P-type semiconductor is a silicon material doped with P, As or other suitable p-type dopants in some embodiments.

Figure 2:

At step 504, a hard mask layer 104 is formed over substrate 102. Examples of a suitable material for hard mask 104 include, but are not limited to, silicon oxide, silicon nitride (e.g., $Si_3N_4$), SiON, SiC, SiOC, and combinations thereof to list only a few possibilities. In some embodiments, hard mask 104 is silicon oxide or silicon nitride. An exemplary structure after forming a hard mask 104 over substrate 102 is shown in FIG. 2.

Figure 3:
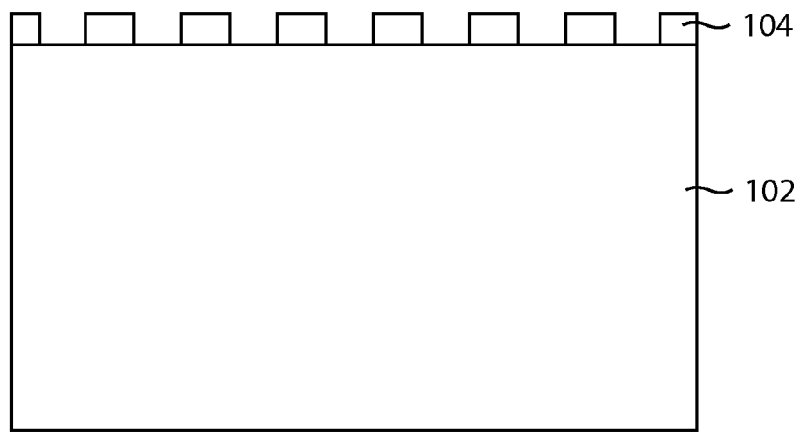
Figure 4:
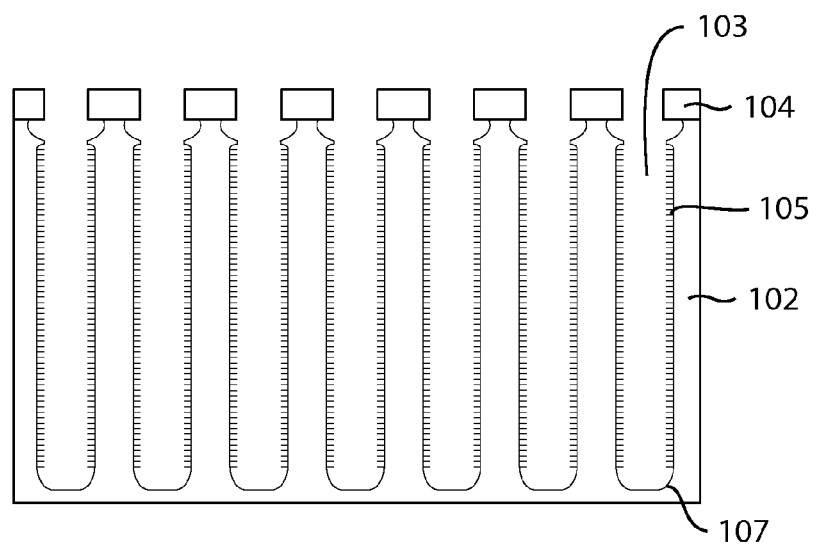

At step 506, hard mask layer 104 and substrate 102 are etched to form a plurality of trenches 103 extending into substrate 102. Step 506 can include two steps in some embodiments. Hard mask layer 104 can be patterned using a method such as photoresist patterning. The resulting structure having patterned hard mask layer 104 is illustrated in FIG. 3. Substrate 102 can be etched to form the plurality of trenches 103. A dry or wet etching method can be used. In some embodiments, etching substrate 102 is performed using plasma. For example, substrate 102 is etched using fluorine-containing plasma. In some embodiments, substrate 102 is etched alternatingly using fluorine-containing and oxygen-containing plasma. The resulting structure with the plurality of trenches 103 inside substrate 102 is illustrated in FIG. 4. As shown in FIG. 4, each trench 103 has at least one side wall 105 and a bottom wall 107. The at least one side wall 105 defined by substrate 102 may not be smooth in some embodiments after step 506.

Figure 5:
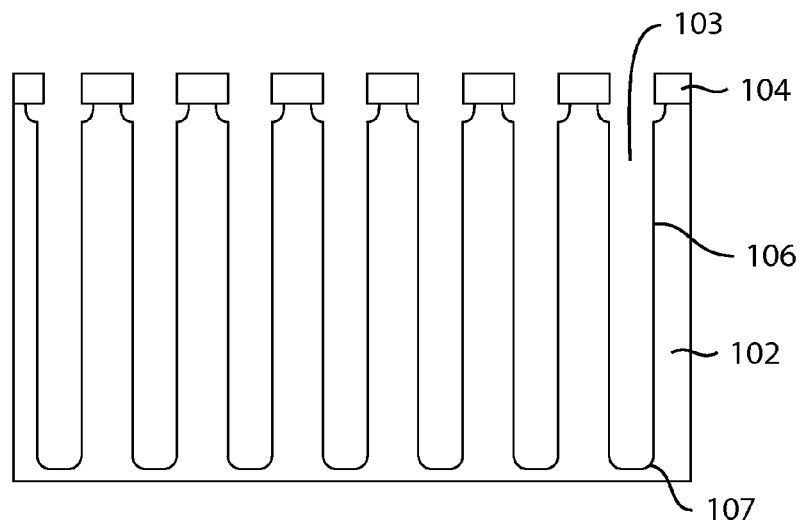

At step 508, in some embodiments, substrate 102 is annealed in a non-oxidizing and non-nitridizing atmosphere. This step of annealing is optional in some embodiments. For example, the step of annealing the substrate 102 is performed in an atmosphere comprising a gas including, but not limited to, hydrogen gas or an inert gas at an increased temperature. In some embodiments, substrate 102 is annealed in hydrogen gas at a temperature of higher than 1000° C. The annealing can last for a time period in the range from 1 second to 30 minutes, for example, or from 30 seconds to 10 minutes. The walls of trenches 103 can become significantly flatter or smoother after the annealing process as shown in FIG. 5.

Figure 6:
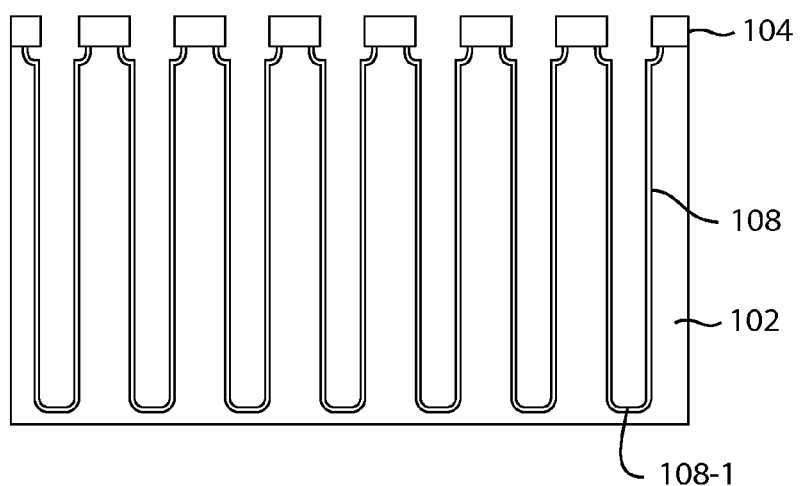

At step 510, at least one barrier insulator layer 108 is formed along the at least one side wall 105 and over the bottom wall 107 of each trench 103. The resulting structure after step 510 is illustrated in FIG. 6. Examples of a suitable material for the at least one barrier insulator layer 108 include, but are not limited to, silicon oxide, silicon nitride, SiON, SiC, SiOC, or any combination thereof. In some embodiments, the at least one barrier insulator layer 108 comprises silicon oxide or silicon nitride. One layer of barrier insulator layer 108 in FIG. 6 is for illustration purpose only as the at least one barrier insulator layer 108 can comprise two or more layers of at least one barrier insulator material. For example, the at least one barrier insulator layer 108 can have a two-layer structure with one layer including silicon oxide and the other layer including silicon nitride. In some embodiments, the at least one barrier insulator layer 108 can have a three-layer oxide-nitride-oxide (ONO) structure comprising silicon oxide, silicon nitride, and silicon oxide. The thickness of barrier insulator layer 108 is in the range of 5-500 angstroms, for example, in the range of 10-100 angstroms in some embodiments.

The at least one barrier insulator layer 108 can be can be formed by a deposition process including, for example, chemical vapor deposition (CVD), plasma enhanced chemical vapor deposition (PECVD), atomic layer deposition (ALD), and physical vapor deposition (PVD). In some embodiments, the at least one barrier insulator layer 108 is formed through an oxidation or nitridization process. For example, the structure of FIG. 5 can be exposed to an atmosphere comprising oxygen or nitrogen at a temperature in the range of 500° C. to 1000° C. The exposure can last for a time period in the range from 5 minutes to 5 hours, for example, in the range from 30 minutes to 3 hours. As shown in FIG. 6, the at least one barrier insulator layer 108 is disposed along the at least one side wall 105 and over the bottom wall 107 of each trench 103. The portion of barrier insulator layer 108 over the bottom wall 107 of each trench 103 is labeled as 108-1.

Figure 7:
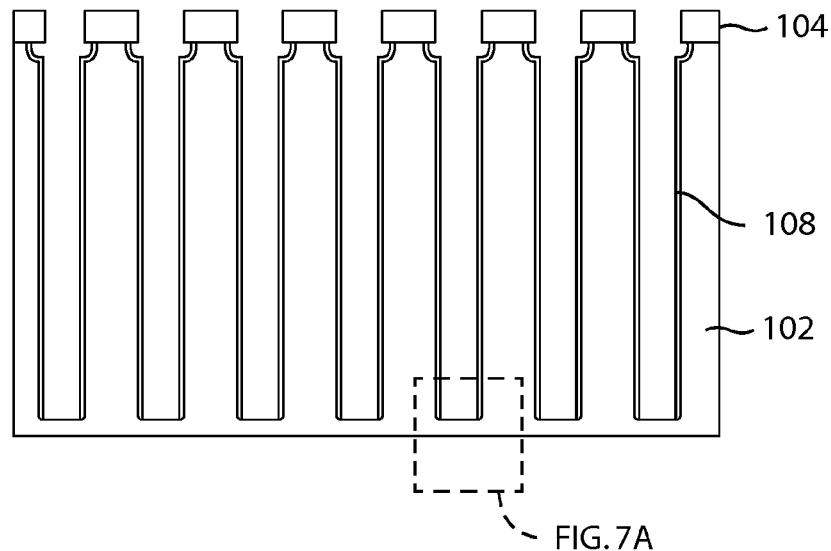
Figure 7A:
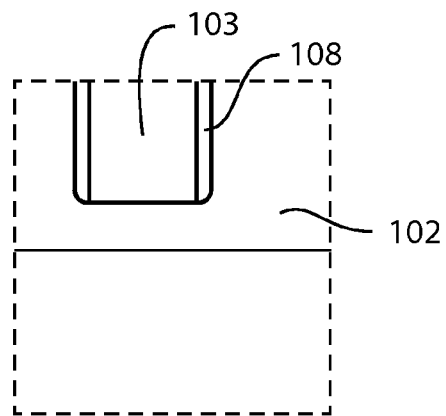

At step 512, the at least one barrier insulator layer 108-1 over the bottom wall 107 of each trench 103 is etched and removed. The resulting structure is illustrated in FIG. 7. FIG. 7A is an enlarged view of a portion of the semiconductor device of FIG. 7. The portion of barrier insulator layer 108-1 can be selectively etched by exposure to a plasma including, but not limited to, a fluorine-containing plasma. For example, step 512 can be performed by exposure to a fluorine-containing plasma for a time period in the range from 1 second to 1 minute, for example, or in the range from 5 seconds to 30 seconds. As shown in FIG. 7A, the at least one barrier insulator layer 108-1 over the bottom wall 107 is removed after step 512.

Figure 8:
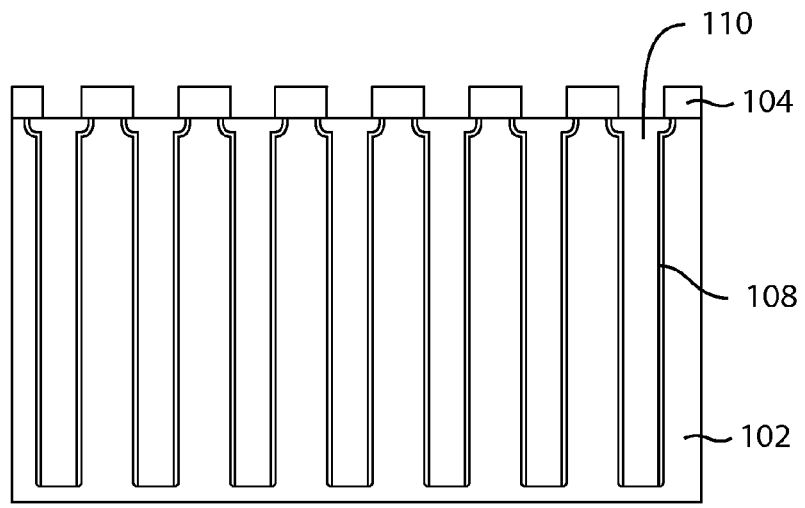

At step 514, a semiconductor material 110 of a second conductivity type is formed to fill the plurality of trenches 103. The resulting structure is illustrated in FIG. 8. Semiconductor material 110 has a crystalline lattice matching with that of substrate 102. In some embodiments, the semiconductor material of the first conductivity type for substrate 102 is n-type semiconductor. One example is a silicon material doped with B, $BF_2$, or any other suitable n-type dopants in some embodiments. The semiconductor material 110 of the second conductivity type is p-type doped. One example is a silicon material doped with P, As or other suitable p-type dopants in some embodiments. In some other embodiments, substrate 102 is p-type semiconductor, and semiconductor material 110 is n-type semiconductor.

In some embodiments, semiconductor material 110 inside trenches 103 is formed through epitaxial growth. The epitaxial growth processes ("epi processes") described herein can be performed in any suitable epitaxy tool. In some embodiments, monocrystalline epitaxial semiconductor material 110 grows on substrate 102 comprising silicon. During the epitaxial process, an in-situ doping can be performed to form semiconductor material 110 of the second conductivity type. In some embodiments the epitaxial growth is implemented by means of chemical vapor deposition, i.e. by chemical reaction in a gas-phase, the product of which is a solid that is epitaxially deposited on the exposed surface.

In some embodiments, method 600 of FIG. 13 can be used in combination with method 500 to make a semiconductor device 100 as shown in FIG. 11 in the present disclosure.

Figure 9:
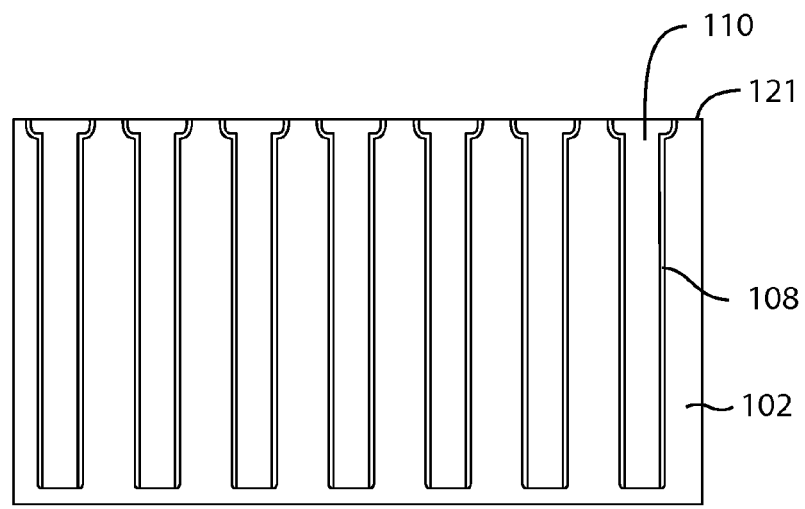

Referring to FIG. 13, at step 602, hard mask layer 104 as shown in FIG. 8 is etched and removed. The resulting structure is illustrated in FIG. 9. Step 602 can be performed through a dry or wet etching process. For example, hard mask layer 104 can be etched using plasma. Examples of a suitable plasma include, but are not limited to, a fluorine-containing plasma.

At step 604, method 600 comprises etching and planarizing substrate 102. The resulting structure is illustrated in FIG. 10. Step 604 can be performed through a two-step process in some embodiments. For example, the structure of FIG. 9 comprising substrate 102, the at least one barrier insulator layer 108, and semiconductor material 110, can be first exposed to a dry etching condition. The top surface 121 of the structure of FIG. 9 is etched using a fluorine-containing plasma. In some embodiments, the top surface 121 of the structure of FIG. 9 is etched alternatingly using fluorine-containing and oxygen-containing plasmas. The top surface 123 of the structure as shown in FIG. 10 is then planarized using a process of chemical mechanical polishing (CMP).

Figure 11A:
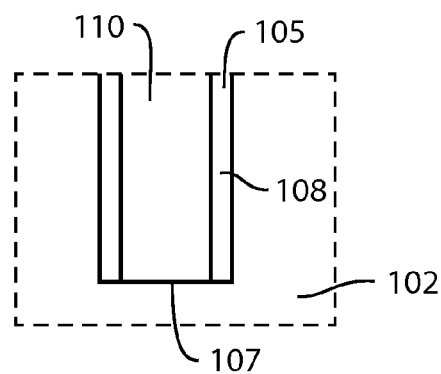
FIG. 11A is an enlarged view of a portion of the semiconductor device of FIG. 11.

At step 606, a plurality of complementary metal oxide semiconductor (CMOS) transistors 125 are formed over the structure of FIG. 10 above substrate 102. FIG. 11 illustrates an exemplary semiconductor device 100 such as a MOS transistor device having a super junction structure in accordance with some embodiments. FIG. 11A is an enlarged view of a portion of the semiconductor device of FIG. 11.

Semiconductor device 100 comprises substrate 102. Substrate 102 comprises a semiconductor material of a first conductivity type as described in FIG. 1. Semiconductor device 100 comprises a plurality of trenches 103 (filled with semiconductor material 110) extending into the substrate 102 as described in FIG. 4. Each trench 103 has at least one side wall 105 and a bottom wall 107 as described in FIG. 5. The at least one barrier insulator layer 108 as described in FIG. 6 is disposed along the at least one side wall 105 of each trench 103. Semiconductor material 110 of a second conductivity type is disposed inside the trench as described in FIGS. 6-7.

As shown in FIG. 11A, semiconductor material 110 of a second conductivity type directly contacts with semiconductor material of the first conductivity type (substrate 102) at the bottom wall 107 of each trench 103. In some embodiments, the at least one side wall 105 of each trench has a significantly flat or smooth surface. In some embodiments, the at least one barrier insulator layer 108 comprises silicon oxide or silicon nitride. In some embodiments, the at least one barrier insulator layer 108 comprises one layer of silicon oxide. In some embodiments, the at least one barrier insulator layer 108 can comprise two or more layers of at least one barrier insulator material, as described in FIGS. 10, 11 and 11A.

As shown in FIG. 11, each CMOS transistor 125 includes a gate structure 114, a source region 116 and a drain region 112. In some embodiments, source region 116 and drain region 112 of each CMOS transistor 125 are disposed over semiconductor material 110 of the second conductivity type. Source region 116 and drain region 112 can share the same conductivity type as semiconductor material 110, but have higher concentrations of dopants. The semiconductor material of the first conductivity type of substrate 102 is a channel layer for each CMOS transistor 125. The semiconductor material 102 of the first conductivity type can be n-type doped, and semiconductor material 110 of the second conductivity type can be p-type doped. Source region 116 and drain region 112 can be a p-type semiconductor with a doping concentration higher than that of semiconductor material 110. Source region 116 and drain region 112 can be referred as p+-type doped.

In some other embodiments, source region 116 and drain region 112 of each CMOS transistor are disposed over semiconductor material 102 of the first conductivity type. Semiconductor material 110 of the second conductivity type is a channel layer for each CMOS transistor. Source region 116 and drain region 112 can share the same conductivity type as substrate 102 but at a higher concentration of dopants.

Exemplary semiconductor device 100 in the present disclosure can comprises other structures such as a gate oxide layer, dielectric layer and a conductive plug. For brevity, they are not illustrated and described in FIG. 11.

The present disclosure provides a method for forming a semiconductor device, and the resulting semiconductor device. In one aspect, the method in the present disclosure comprises forming a hard mask layer over a substrate comprising a semiconductor material of a first conductivity type, and forming a plurality of trenches in the hard mask layer and extending into the substrate. Each trench has at least one side wall and a bottom wall. The method further comprises forming at least one barrier insulator layer along the at least one side wall and over the bottom wall of each trench, removing the at least one barrier insulator layer over the bottom wall of each trench, and filling the plurality of trenches a semiconductor material of a second conductivity type. In some embodiments, the method includes annealing the substrate in a non-oxidizing and non-nitridizing atmosphere, before forming the at least one barrier insulator layer. For example, the step of annealing the substrate is performed in an atmosphere comprising hydrogen gas at an increased temperature in some embodiments.

In some embodiments, the semiconductor material of the second conductivity type is formed through epitaxial growth. In some embodiments, the at least one barrier insulator layer comprises silicon oxide or silicon nitride. The at least one barrier insulator layer can comprise two or more layers of at least one barrier insulator material. In some embodiments, the semiconductor material of the first conductivity type is n-type doped and the semiconductor material of the second conductivity type is p-type doped.

In some embodiments, the method in the present disclosure further comprises: etching to remove the hard mask layer, etching and planarizing the substrate, and forming a plurality of CMOS transistors over the substrate. Each CMOS transistor includes a gate structure, a source region, and a drain region. In some embodiments, the source region and the drain region of each CMOS transistor are disposed over the semiconductor material of the second conductivity type. The semiconductor material of the first conductivity type is a channel layer for each CMOS transistor.

In some embodiments, a method for forming a semiconductor device comprises forming a hard mask layer over a substrate comprising a semiconductor material of a first conductivity type, and etching the hard mask layer and the substrate to form a plurality of trenches extending into the substrate. Each trench has at least one side wall and a bottom wall. The method further comprises annealing the substrate in a non-oxidizing and non-nitridizing atmosphere to smooth the at least one side wall of each trench, forming at least one barrier insulator layer along the at least one side wall and over the bottom wall of each trench, etching to remove the at least one barrier insulator layer over the bottom wall of each trench, and forming a semiconductor material of a second conductivity type through epitaxial growth to fill the plurality of trenches. The method further comprises etching to remove the hard mask layer, etching and planarizing the substrate, and forming a plurality of CMOS transistors over the substrate.

In another aspect, the present disclosure provides a semiconductor device. The semiconductor device comprises a substrate, a plurality of trenches extending into the substrate, and at least one barrier insulator layer. The substrates comprise a semiconductor material of a first conductivity type. Each trench has at least one side wall and a bottom wall. The at least one barrier insulator layer is disposed along the at least one side wall of each trench. The device further comprises a semiconductor material of a second conductivity type disposed inside the trench. The semiconductor material of a second conductivity type directly contacts the semiconductor material of the first conductivity type at the bottom wall of each trench.

In some embodiments, the at least one side wall of each trench has a significantly flat surface. In some embodiments, the at least one barrier insulator layer comprises silicon oxide or silicon nitride. The at least one barrier insulator layer can comprise two or more layers of at least one barrier insulator material. In some embodiments, the semiconductor material of the first conductivity type is n-type doped, and the semiconductor material of the second conductivity type is p-type doped.

In some embodiments, the semiconductor device further comprises a plurality of CMOS transistors over the substrate. Each CMOS transistor comprises a gate structure, a source region and a drain region. In some embodiments, the source region and the drain region of each CMOS transistor are disposed over the semiconductor material of the second conductivity type. The semiconductor material of the first conductivity type is a channel layer for each CMOS transistor. In some embodiments, the source region and the drain region of each CMOS transistor are disposed over the semiconductor material of the first conductivity type; and the semiconductor material of the second conductivity type is a channel layer for each CMOS transistor.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a semiconductor device, comprising:
   forming a hard mask layer over a substrate comprising a semiconductor material of a first conductivity type;
   forming a plurality of trenches in the hard mask layer and extending into the substrate, each trench having at least one side wall and a bottom wall, the plurality of trenches being substantially parallel to each other;
   forming at least one barrier insulator layer along the at least one side wall and over the bottom wall of each trench, the at least one barrier insulator layer contacting the semiconductor material of a first conductivity type;
   removing the at least one barrier insulator layer over the bottom wall of each trench; and
   filling the plurality of trenches with a semiconductor material of a second conductivity type.

2. The method of claim 1, further comprising:
   annealing the substrate in a non-oxidizing and non-nitridizing atmosphere, before forming the at least one barrier insulator layer.

3. The method of claim 2, wherein the step of annealing the substrate is performed in an atmosphere comprising hydrogen gas at an increased temperature.

4. The method of claim 1, wherein the semiconductor material of the second conductivity type is formed in the plurality of trenches through epitaxial growth.

5. The method of claim 1, wherein the at least one barrier insulator layer comprises silicon oxide or silicon nitride.

6. The method of claim 1, wherein the at least one barrier insulator layer comprises two or more layers of at least one barrier insulator material.

7. The method of claim 1, wherein the semiconductor material of the first conductivity type is n-type doped and the semiconductor material of the second conductivity type is p-type doped.

8. The method of claim 1, further comprising:
   etching to remove the hard mask layer;
   etching and planarizing the substrate; and
   forming a plurality of complementary metal oxide semiconductor (CMOS) transistors over the substrate, each CMOS transistor comprising a gate structure, a source region and a drain region, wherein the source region and the drain region of each CMOS transistor are disposed over and directly contacting either of the semiconductor material of the first conductivity type and the semiconductor material of the second conductivity type.

9. The method of claim 8, wherein
   the source region and the drain region of each CMOS transistor are disposed over the semiconductor material of the second conductivity type; and
   the semiconductor material of the first conductivity type is a channel layer for each CMOS transistor.

10. A method for forming a semiconductor device, comprising:
    forming a hard mask layer over a substrate comprising a semiconductor material of a first conductivity type;
    etching the hard mask layer and the substrate to form a plurality of trenches extending into the substrate, each trench having at least one side wall and a bottom wall, the plurality of trenches being substantially parallel to each other;
    annealing the substrate in a non-oxidizing and non-nitridizing atmosphere to smooth the at least one side wall of each trench;
    forming at least one barrier insulator layer along the at least one side wall and over the bottom wall of each trench, the at least one barrier insulator layer contacting the semiconductor material of a first conductivity type;
    etching to remove the at least one barrier insulator layer over the bottom wall of each trench; and
    forming a semiconductor material of a second conductivity type through epitaxial growth to fill the plurality of trenches.

11. The method of claim 10, wherein the at least one barrier insulator layer comprises two or more layers of at least one barrier insulator material.

12. The method of claim 10, further comprising:
    etching to remove the hard mask layer;
    etching and planarizing the substrate; and
    forming a plurality of complementary metal oxide semiconductor (CMOS) transistors over the substrate, each CMOS transistor comprising a gate structure, a source region, and a drain region, wherein the source region and the drain region of each CMOS transistor are disposed over and directly contacting either of the semiconductor material of the first conductivity type and the semiconductor material of the second conductivity type.

13. A semiconductor device, comprising:
    a substrate comprising a semiconductor material of a first conductivity type and a plurality of trenches extending into the substrate, each trench having at least one side wall and a bottom wall;
    at least one barrier insulator layer disposed along the at least one side wall of each trench;
    a semiconductor material of a second conductivity type filling the trench and directly contacting the semiconductor material of the first conductivity type at the bottom wall of each trench; and
    a plurality of complementary metal oxide semiconductor (CMOS) transistors over the substrate, each CMOS transistor comprising a gate structure, a source region, and a drain region,
    wherein the source region and the drain region of each CMOS transistor are disposed over and directly contacting either of the semiconductor material of the first conductivity type and the semiconductor material of the second conductivity type.

14. The semiconductor device of claim 13, wherein the at least one side wall of each trench has a flat surface.

15. The semiconductor device of claim 13, wherein the at least one barrier insulator layer comprises silicon oxide or silicon nitride.

16. The semiconductor device of claim 13, wherein the at least one barrier insulator layer comprises two or more layers of at least one barrier insulator material.

17. The semiconductor device of claim 13, wherein the semiconductor material of the first conductivity type is n-type doped and the semiconductor material of the second conductivity type is p-type doped.

18. The semiconductor device of claim 13,
the source region and the drain region of each CMOS transistor are disposed over the semiconductor material of the second conductivity type; and
the semiconductor material of the first conductivity type is a channel layer for each CMOS transistor.

19. The semiconductor device of claim 13,
the source region and the drain region of each CMOS transistor are disposed over the semiconductor material of the first conductivity type; and
the semiconductor material of the second conductivity type is a channel layer for each CMOS transistor.

\* \* \* \* \*